(12) United States Patent
Miao et al.

(10) Patent No.: US 12,230,676 B2
(45) Date of Patent: Feb. 18, 2025

(54) NANOSHEET DEVICE WITH TRI-LAYER BOTTOM DIELECTRIC ISOLATION

(71) Applicant: International Business Machines Corporation, Armonk, NY (US)

(72) Inventors: Xin Miao, San Jose, CA (US); Jingyun Zhang, Albany, NY (US); Alexander Reznicek, Troy, NY (US); Choonghyun Lee, Chigasaki (JP)

(73) Assignee: International Business Machines Corporation, Armonk, NY (US)

(*) Notice: Subject to any disclaimer, the term of this patent is extended or adjusted under 35 U.S.C. 154(b) by 562 days.

(21) Appl. No.: 17/449,060

(22) Filed: Sep. 27, 2021

(65) Prior Publication Data
US 2023/0099214 A1   Mar. 30, 2023

(51) Int. Cl.
| H01L 29/10 | (2006.01) |
| H01L 29/06 | (2006.01) |
| H01L 29/66 | (2006.01) |
| H01L 29/78 | (2006.01) |

(52) U.S. Cl.
CPC ...... *H01L 29/1083* (2013.01); *H01L 29/0665* (2013.01); *H01L 29/66545* (2013.01); *H01L 29/785* (2013.01)

(58) Field of Classification Search
CPC ............. H01L 29/1083; H01L 29/1079; H01L 29/42392; H01L 29/6659
See application file for complete search history.

(56) References Cited

U.S. PATENT DOCUMENTS

| 6,407,435 B1 | 6/2002 | Ma |
| 9,704,962 B1 | 7/2017 | Pawlak |
| 10,032,867 B1 | 7/2018 | Yeung |
| 10,128,334 B1 * | 11/2018 | Bourjot ............ H01L 29/78696 |
| 10,840,329 B1 | 11/2020 | Ruilong |
| 10,937,860 B2 | 3/2021 | Bi |

(Continued)

FOREIGN PATENT DOCUMENTS

CN    113053822 A    6/2021

OTHER PUBLICATIONS

Notification of Transmittal of the International Search Report and the Written Opinion of the International Searching Authority, or the Declaration, International Application No. PT/CN2022/113044, Sep. 27, 2022, 9 pgs.

*Primary Examiner* — Syed I Gheyas
*Assistant Examiner* — Casey Paul Boatman
(74) *Attorney, Agent, or Firm* — Schmeiser, Olsen & Watts, LLP; Matt Zehrer (57) ABSTRACT

A nanosheet device includes a bottom dielectric isolation formed by a first portion of a high-k dielectric layer above a semiconductor substrate, a spacer material above the first portion of the high-k dielectric layer and a second portion of the high-k dielectric layer above the spacer material. A sequence of semiconductor channel layers are stacked perpendicularly to the semiconductor substrate above the bottom dielectric isolation and are separated by and vertically aligned with a metal gate stack. Source/drain regions extend laterally from opposite ends of the semiconductor channel layers with a bottom surface of the source/drain regions being in direct contact with the bottom dielectric isolation for electrically isolating the source/drain regions from the semiconductor substrate.

18 Claims, 8 Drawing Sheets

(56) References Cited

U.S. PATENT DOCUMENTS

| | | |
|---|---|---|
| 2015/0303258 A1 | 10/2015 | Kuhn |
| 2016/0190288 A1 | 6/2016 | Doris |
| 2017/0117359 A1 | 4/2017 | Cheng |
| 2018/0219064 A1* | 8/2018 | Cheng .................... B82Y 10/00 |
| 2018/0301531 A1 | 10/2018 | Xie |
| 2020/0052124 A1 | 2/2020 | Miao et al. |
| 2020/0075720 A1* | 3/2020 | Cheng ................ H01L 29/78696 |
| 2020/0365687 A1* | 11/2020 | Xie ..................... H01L 27/0886 |
| 2022/0352312 A1* | 11/2022 | Cheng ................ H01L 29/66439 |
| 2023/0027413 A1* | 1/2023 | Park .................... H01L 29/4983 |

* cited by examiner

NANOSHEET DEVICE WITH TRI-LAYER BOTTOM DIELECTRIC ISOLATION

BACKGROUND

The present invention generally relates to the field of complementary metal-oxide semiconductor (CMOS) devices, and more particularly to nanosheet field effect transistor devices.

In contemporary semiconductor device fabrication processes a large number of semiconductor devices, such as field effect transistors (FETs), are fabricated on a single wafer. Some non-planar device architectures, including nanosheet FETs, provide increased device density and increased performance over planar devices. In nanosheet FETs, in contrast to conventional FETs, the gate stack wraps around the full perimeter of each nanosheet, enabling fuller depletion in the channel region, and reducing short-channel effects. The wrap-around gate structures used in nanosheet devices also enable greater management of leakage current in the active regions, even as drive currents increase.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanosheets or nanowires. The nanosheets or nanowires can be used to form gate-all-around devices. A bottom dielectric isolation (BDI) layer is typically formed between source/drain regions and the semiconductor substrate to electrically isolate these regions. However, process steps performed after formation of the bottom dielectric isolation layer can erode the BDI, reducing the effectiveness of the bottom isolation layer.

SUMMARY

According to an embodiment of the present disclosure, a semiconductor structure includes a bottom dielectric isolation disposed above a semiconductor substrate, the bottom dielectric isolation includes a first portion of a high-k dielectric layer above the semiconductor substrate, a spacer material above the first portion of the high-k dielectric layer and a second portion of the high-k dielectric layer above the spacer material, a sequence of semiconductor channel layers stacked perpendicularly to the semiconductor substrate and above the bottom dielectric isolation, the sequence of semiconductor channel layers being separated by and vertically aligned with a metal gate stack, and source/drain regions extending laterally from opposite ends of the semiconductor channel layers, a bottom surface of the source/drain regions being in direct contact with the bottom dielectric isolation for electrically isolating the source/drain regions from the semiconductor substrate.

According to another embodiment of the present disclosure, a method of forming a semiconductor structure includes forming a bottom dielectric isolation above a semiconductor substrate, the bottom dielectric isolation includes a first portion of a high-k dielectric layer above the semiconductor substrate, a spacer material above the first portion of the high-k dielectric layer and a second portion of the high-k dielectric layer above the spacer material, forming a sequence of semiconductor channel layers stacked perpendicularly to the semiconductor substrate and above the bottom dielectric isolation, the sequence of semiconductor channel layers being separated by and vertically aligned with a metal gate stack, and forming source/drain regions extending laterally from opposite ends of the semiconductor channel layers, a bottom surface of the source/drain regions being in direct contact with the bottom dielectric isolation for electrically isolating the source/drain regions from the semiconductor substrate.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Parasitic source-to-drain "punch-through" leakage through the substrate increases as the transistor gate length is scaled down. Due to the parasitic channel being below the nanosheet stack, the source/drain leakage current is very challenging for nanosheet transistors to suppress. A bottom dielectric isolation (BDI) layer which separates epitaxy of the source and of the drain regions from touching the substrate provides a solution to block the leakage in the sub-nanosheet region by adding an insulator layer beneath the source/drain and channel regions.

However, in current process of record (POR), the BDI is typically formed by a single layer of dielectric material that can be easily damaged during processes such as spacer and inner spacer formation, source/drain contact patterning and epitaxial pre-cleans. This damage can erode the BDI thickness leading back to increased source/drain leakage and degradation in device performance.

Therefore, embodiments of the present disclosure, provide a tri-layer bottom dielectric isolation (BDI), and a method of making the same, consisting of an isolation material sandwiched between layers of a high-k dielectric material. The proposed tri-layer BDI involves etch-resistant materials that can prevent over etching the BDI layer and electrically isolate source/drain epi regions from the semiconductor substrate. This in turn may reduce current leakage via the semiconductor substrate and improve device performance.

Embodiments by which the tri-layer bottom dielectric isolation can be formed to electrically isolate source/drain epi regions from the semiconductor substrate are described in detailed below by referring to the accompanying drawings in FIGS. 1-13.

Figure 1:
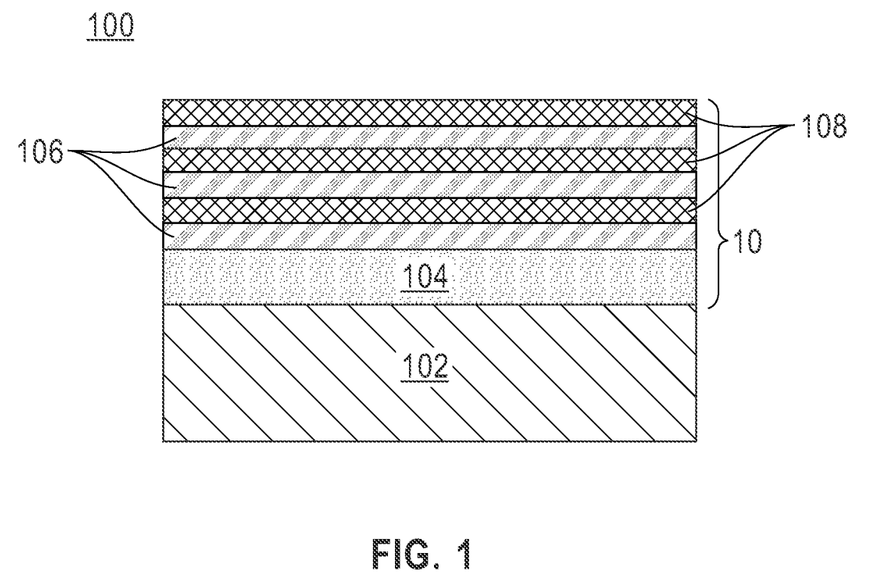
FIG. 1 is a cross-sectional view of a semiconductor structure depicting a nanosheet stack formed over a semiconductor substrate, according to an embodiment of the present disclosure.

Referring now to FIG. 1, a cross-sectional view of a semiconductor structure 100 including a nanosheet stack 10 formed over a semiconductor substrate 102 is shown, according to an embodiment of the present disclosure.

In this embodiment, an alternating sequence of layers of sacrificial semiconductor material and layers of semiconductor channel material vertically stacked one on top of another in a direction perpendicular to the semiconductor substrate 102 forms the nanosheet stack 10, as illustrated in the figure. Specifically, the alternating sequence includes a nanosheet stack sacrificial layer 104 above the semiconductor substrate 102, a sacrificial semiconductor layer 106 above the nanosheet stack sacrificial layer 104, and a semiconductor channel layer 108. In the example depicted in the figure, alternating sacrificial semiconductor layers 106 and semiconductor channel layers 108 are formed in a stack above the nanosheet stack sacrificial layer 104 on the semiconductor substrate 102. The term sacrificial, as used herein, means a layer or other structure, that is (or a part thereof is) removed before completion of the final device. For instance, in the example being described, portions of the sacrificial semiconductor layers 106 will be removed from the stack in the channel region of the device to permit the semiconductor channel layers 108 to be released from the nanosheet stack 10. It is notable that while in the present example the sacrificial semiconductor layers 106 and the semiconductor channel layers 108 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

The semiconductor substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the semiconductor substrate 102 may be approximately, but is not limited to, several hundred microns thick. In other embodiments, the semiconductor substrate 102 may be a layered semiconductor such as a silicon-on-insulator or SiGe-on-insulator, where a buried insulator layer, separates a base substrate from a top semiconductor layer.

With continued reference to FIG. 1, a first layer in the stack (a sacrificial layer), i.e., the nanosheet stack sacrificial layer 104, is formed on the semiconductor substrate 102.

According to an exemplary embodiment, the nanosheet stack sacrificial layer 104 in the nanosheet stack 10 is formed using an epitaxial growth process. For instance, in the described embodiment, the nanosheet stack sacrificial layer 104 is formed by epitaxially growing a layer of SiGe with a germanium concentration varying between approximately 50 atomic percent to approximately 70 atomic percent, and ranges therebetween. The higher concentration of germanium atoms allows the nanosheet stack sacrificial layer 104 to be subsequently removed selective to the remaining alternating layers of the nanosheet stack 10, as will be described in detail below. By way of example only, the nanosheet stack sacrificial layer 104 may be formed having a thickness varying from approximately 20 nm to approximately 35 nm, although thicknesses greater than 20 nm and less than 35 nm may also be used.

In general, layers in the nanosheet stack 10 (e.g., SiGe/Si layers) can be formed by epitaxial growth by using the semiconductor substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the alternating sequence of SiGe/Si layers in the nanosheet stack 10. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 1, similar to the nanosheet stack sacrificial layer 104, the sacrificial semiconductor layers 106 are formed by epitaxially growing a layer of SiGe. However, the germanium concentration of the sacrificial semiconductor layers 106 varies from approximately 20 atomic percent to approximately 40 atomic percent. In an exemplary embodiment, the sacrificial semiconductor layers 106 are made of SiGe with a germanium concentration of approximately 25 atomic percent.

To continue building the nanosheet stack 10, the semiconductor channel layers 108 are formed by epitaxially growing a Si layer. As depicted in the figure, the sacrificial semiconductor layers 106 and the semiconductor channel layers 108 in the nanosheet stack 10 are thinner than the underlying nanosheet stack sacrificial layer 104 and have a substantially similar or identical thickness. As shown in FIG. 1, the nanosheet stack 10 is grown by forming (SiGe) sacrificial semiconductor layers 106 and (Si) semiconductor channel layers 108 in an alternating manner onto the nanosheet stack sacrificial layer 104. Accordingly, each of the sacrificial semiconductor layers 106 and the semiconductor channel layers 108 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 108 in the nanosheet stack 10 will be used to form the channel layers of the device. Consequently, the dimensions of the semiconductor channel layers 108 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "p-FET") or a negative channel Field Effect Transistor (hereinafter "n-FET") device. The cross-sectional view of FIG. 1 runs along a length of the nanosheet stack 10, where the nanosheet stack 10 runs from left to right.

Figure 2:
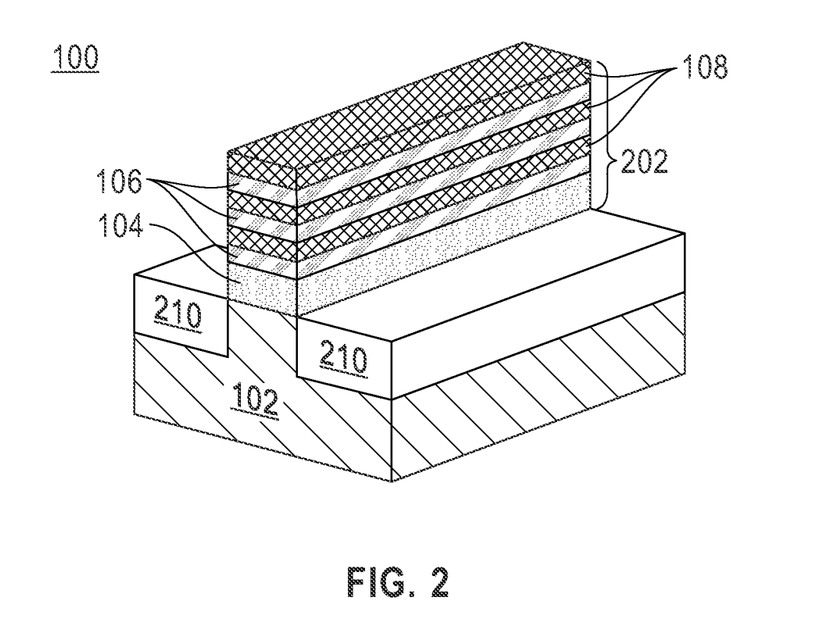
FIG. 2 is a three-dimensional (3D) view of the semiconductor structure following the patterning of nanosheet fins from the nanosheet stack, according to an embodiment of the present disclosure.

Referring now to FIG. 2, a 3D view of the semiconductor structure 100 is shown following the patterning of a nanosheet fin (hereinafter "fin") 202 from the nanosheet stack 10 (FIG. 1), according to an embodiment of the present disclosure. The fin 202 can be formed by, for example, a photolithographic patterning and etching process that removes portions of the nanosheet stack 10 (FIG. 1) and portions of the semiconductor substrate 102. Any suitable etching process can be used such as, for example, reactive ion etching (RIE).

Etching generally refers to the removal of a material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. RIE operates under conditions intermediate between sputter and plasma etching and may be used to produce deep, narrow features, such as shallow trench isolation (STI) trenches.

It should be noted that portions of the semiconductor substrate 102 removed during the photolithographic patterning process are subsequently filled with an insulating material to form STI regions 210. The process of forming the STI regions 210 is standard and well-known in the art, it typically involves depositing the insulating material to substantially fill areas of the semiconductor structure 100 between adjacent fins 202 (not shown) for electrically isolating the fin 202. The STI regions 210 may be formed by, for example, chemical vapor deposition (CVD) of a dielectric material. Non-limiting examples of dielectric materials to form the STI regions 210 include silicon oxide, silicon nitride, hydrogenated silicon carbon oxide, silicon based low-k dielectrics, flowable oxides, porous dielectrics, or organic dielectrics including porous organic dielectrics.

Figure 3:
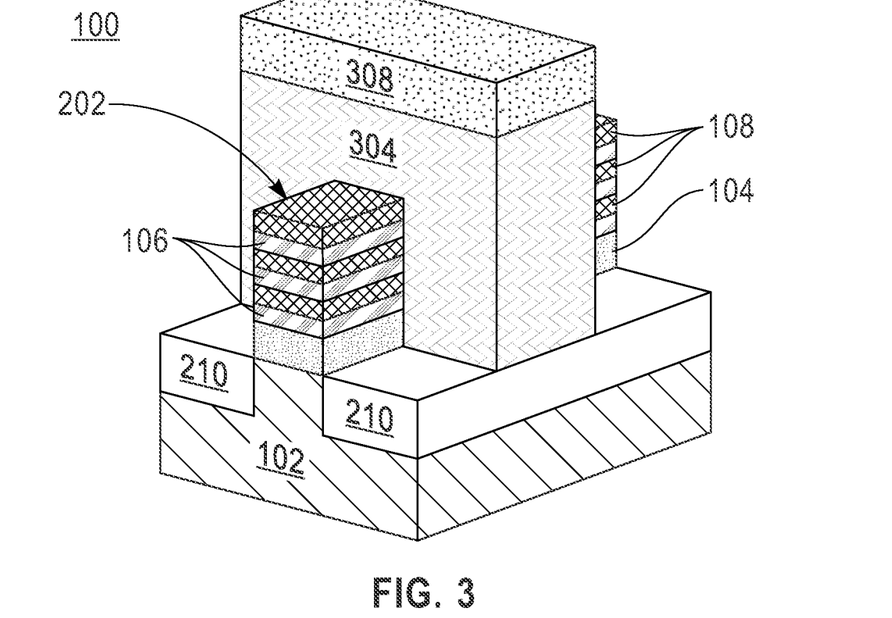
FIG. 3 is a 3D view of the semiconductor structure depicting the formation of a dummy gate, according to an embodiment of the present disclosure.

Referring now to FIG. 3, a 3D view of the semiconductor structure 100 depicting the formation of a dummy gate 304 is shown, according to an embodiment of the present disclosure. The dummy gate 304 is formed and patterned over a top surface and along sidewalls of the fin 202. The dummy gate 304 can be formed using conventional techniques known in the art. For example, the dummy gate 304 may be formed from amorphous silicon (a-Si). A hard mask 308 is typically formed over the dummy gate 304 to act as an etch stop. The hard mask 308 is generally formed from silicon nitride, silicon oxide, an oxide/nitride stack, or similar materials and configurations.

Figure 4:
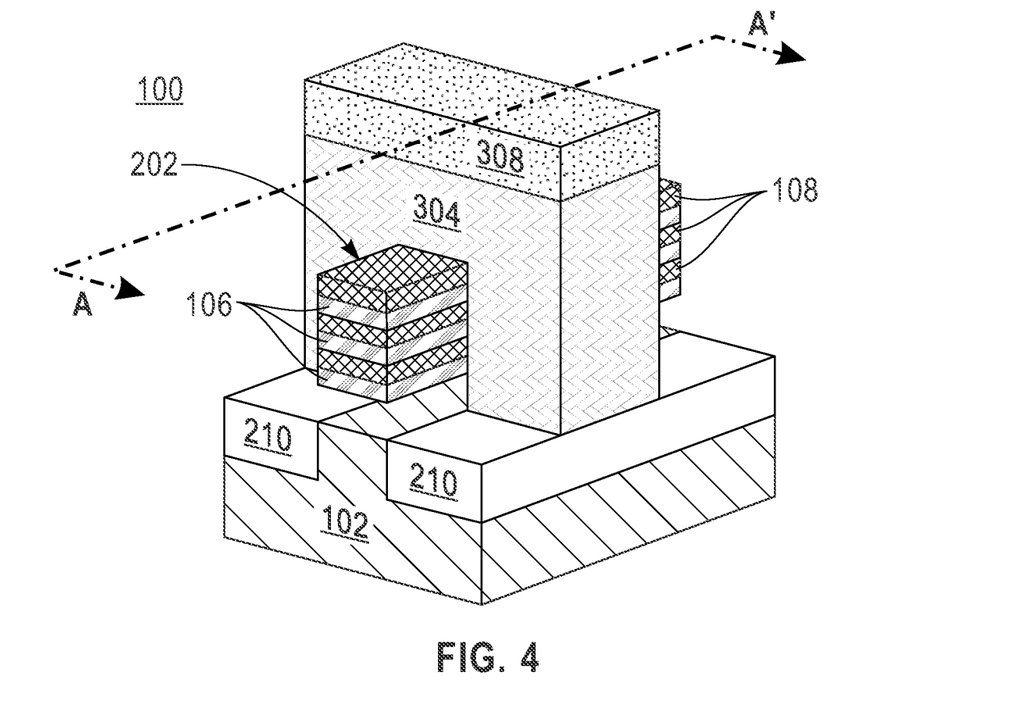
FIG. 4 is a 3D view of the semiconductor structure depicting removing a nanosheet stack sacrificial layer, according to an embodiment of the present disclosure.
Figure 5:
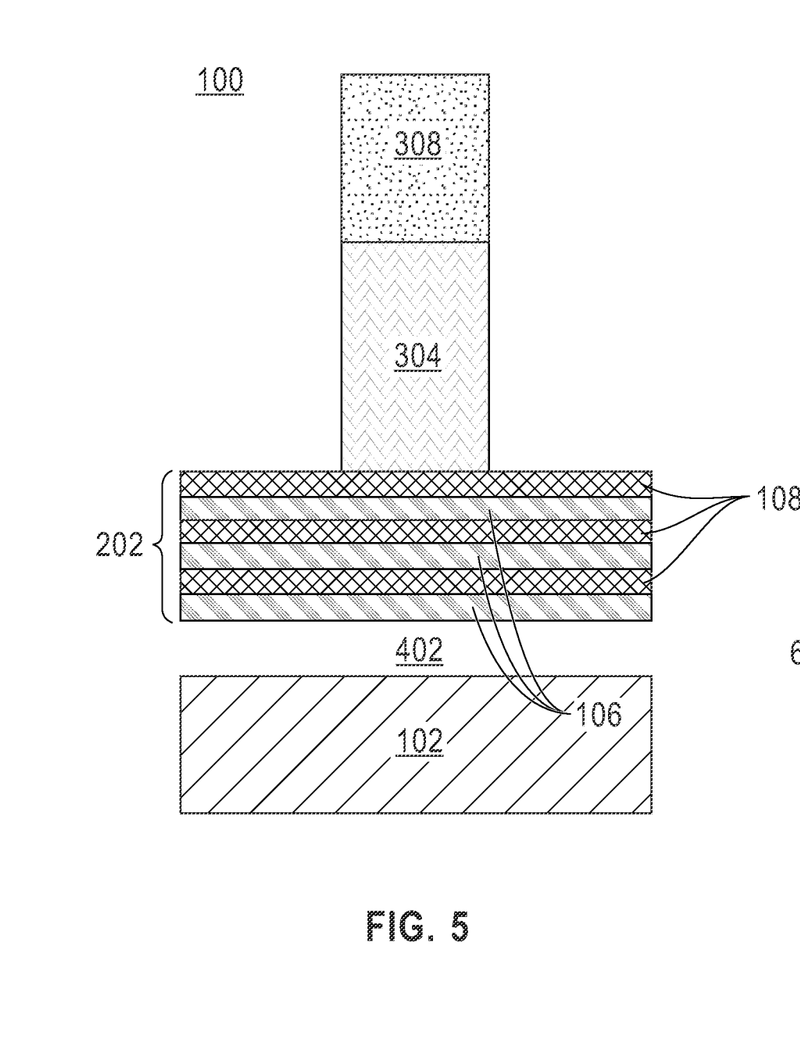
FIG. 5 is a cross-sectional view of the semiconductor structure of FIG. 4 taken along line A-A', according to an embodiment of the present disclosure.

Referring now to FIG. 4, a 3D view of the semiconductor structure 100 is shown after removing the nanosheet stack sacrificial layer 104, according to an embodiment of the present disclosure. As depicted in the figure, removal of the nanosheet stack sacrificial layer 104 creates an opening or air gap 402 (FIG. 5) in the semiconductor structure 100, in the area from which the nanosheet stack sacrificial layer 104 was removed. FIG. 5 shows a cross-sectional view of the semiconductor structure 100 taken along line A-A'.

In an embodiment, the nanosheet stack sacrificial layer 104 is removed selective to the semiconductor substrate 102, the sacrificial semiconductor layers 106, the semiconductor channel layers 108, the dummy gate 304 and the hard mask 308. For example, a highly selective dry etch process can be used to selectively remove the nanosheet stack sacrificial layer 104.

Figure 6:
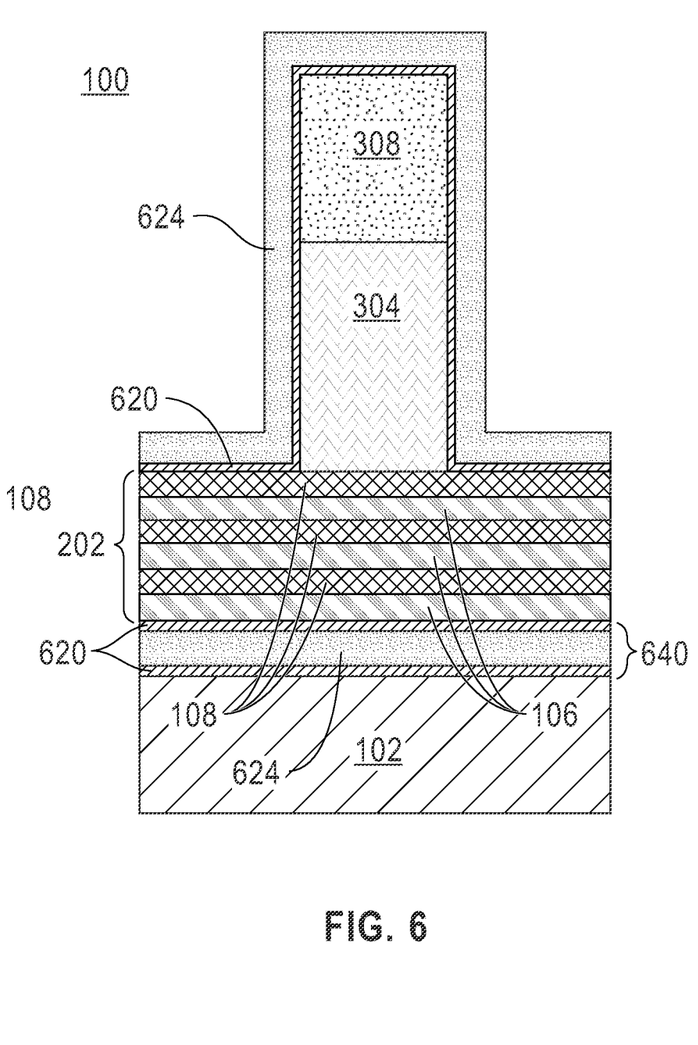
FIG. 6 is a cross-sectional view of the semiconductor structure depicting forming a high-k dielectric layer followed by the formation of a layer of a spacer material, according to an embodiment of the present disclosure.

Referring now to FIG. 6, a cross-sectional view of the semiconductor structure 100 taken along line A-A' (FIG. 4) is shown after forming a high-k dielectric layer 620 followed by a layer of a spacer material 624, according to an embodiment of the present disclosure. As depicted in the figure, the high-k dielectric layer 620 is formed along an upper surface of the opening 402 (FIG. 5), along a lower surface of the opening 402 (FIG. 5) and on exposed surfaces of the semiconductor structure 100. Specifically, the high-k dielectric layer 620 is also formed on exposed horizontal surfaces of the uppermost semiconductor channel layer 108 (i.e., horizontal surfaces not covered by the dummy gate 304), vertical side surfaces (or opposite sidewalls) of the dummy gate 304, and vertical side surfaces (or opposite sidewalls) and an upper surface of the hard mask 308.

The high-k dielectric layer 620 may not entirely fill the opening 402 (FIG. 5), leaving an innermost portion of the opening 402 (FIG. 5) open for deposition of the spacer material 624. Stated differently, deposition of the spacer material 624 occurs within a remainder of the opening 402 (FIG. 5), with layers of the high-k dielectric layer 620 above the spacer material 624 and below the spacer material 624, as depicted in the figure. More particularly, a (top) portion of the high-k dielectric layer 620 below the lowermost sacrificial semiconductor layer 106 is located above the spacer material 624, while a (bottom) portion of the high-k dielectric layer 620 above the semiconductor substrate 102 is disposed below the spacer material 624.

Accordingly, by depositing the spacer material 624 between layers of the high-k dielectric layer 620, a tri-layer bottom dielectric isolation (BDI) 640 is formed within the opening 402 (FIG. 5) which may provide an enhanced bottom dielectric isolation region for preventing source/drain leakage via the semiconductor substrate 102.

According to an embodiment, the high-k dielectric layer 620 includes a material highly resistant to etching. Non-limiting examples of etch-resistant materials for forming the high-k dielectric layer 620 may include metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k dielectric layer 620 may be deposited using typical deposition techniques including, for example, atomic layer deposition (ALD). A thickness of the high-k dielectric layer 620 may vary from approximately 2 nm to approximately 3 nm, and ranges therebetween.

With continued reference to FIG. 6, in addition to filling a remaining space of the opening 402 (FIG. 5), the spacer material 624 may also cover upper exposed surfaces of the semiconductor structure 100, as shown in the figure. Particularly, the spacer material 624 may be deposited above the high-k dielectric layer 620 located or disposed above the horizontal surface of the uppermost semiconductor channel layer 108, above the high-k dielectric layer 620 located above the vertical side surfaces of the dummy gate 304, and above the high-k dielectric layer 620 located on the vertical side surfaces and the upper surface of the hard mask 308.

Non-limiting examples of various materials for forming the spacer material 624 may include silicon oxycarbide (SiOC), silicon carbon nitride (SiCN), silicon carbide (SiC), aluminum oxide (AlO$_x$), and the like.

The spacer material 624 may be deposited using typical deposition techniques, for example, atomic layer deposition (ALD), molecular layer deposition (MLD), and chemical vapor deposition (CVD). A thickness of the spacer material 624 located between layers of the high-k dielectric layer 620 depends on a size of the remaining space. In an embodiment, the spacer material 624 may be at least 3 nm thick. In other embodiments, the spacer material 624 may be approximately 5 nm to approximately 20 nm thick.

At this point of the semiconductor manufacturing process, the semiconductor structure 100, as depicted in the figure, includes a first portion of the high-k dielectric layer 620 over the semiconductor substrate 102, the spacer material 624 above the first portion of the high-k dielectric layer 620, a second portion of the high-k dielectric layer 620 above the spacer material 624, all beneath the fin 202 including the alternating sacrificial semiconductor layers 106 and semiconductor channel layers 108.

Figure 7:
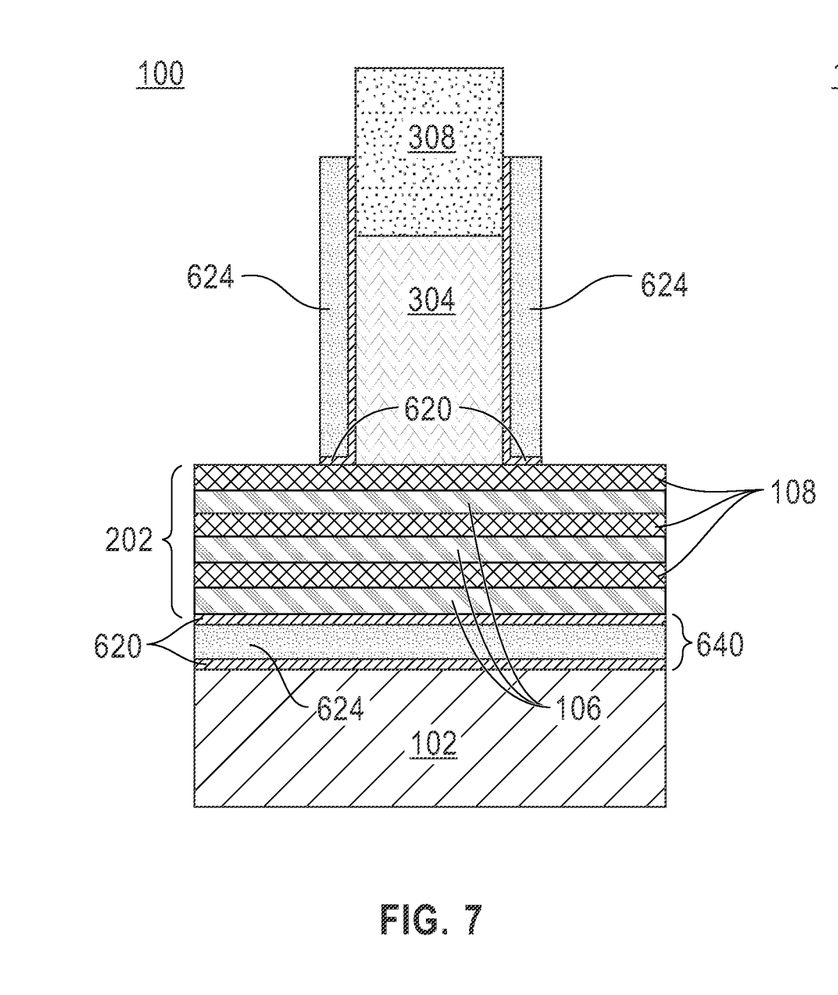
FIG. 7 is a cross-sectional view of the semiconductor structure depicting etching the high-k dielectric layer and the spacer material, according to an embodiment of the present disclosure.

Referring now to FIG. 7, a cross-sectional view of the semiconductor structure 100 taken along line A-A' (FIG. 4) is shown after etching the high-k dielectric layer 620 and the spacer material 624, according to an embodiment of the present disclosure.

In this embodiment, a directional etch is conducted on the semiconductor structure 100 to partially remove bottom portions of the spacer material 624 and bottom portions of the high-k dielectric layer 620 located above the uppermost semiconductor channel layer 108 of the fin 202. Stated differently, bottom portions of the spacer material 624 and bottom portions of the high-k dielectric layer 620 parallel to the uppermost semiconductor channel layer 108 are removed via a directional etch process. As illustrated in the figure, upper portions of the spacer material 624 and upper portion of the high-k dielectric layer 620 located on opposing sidewalls and an upper surface of the hard mask 308 may also be removed during the directional etch process exposing a top portion of the hard mask 308 in preparation for a replacement metal gate process.

In an exemplary embodiment, a reactive-ion-etching (RIE) process can be performed on the semiconductor structure 100 to remove bottom and upper portions of the spacer material 624 and high-k dielectric layer 620.

Figure 8:
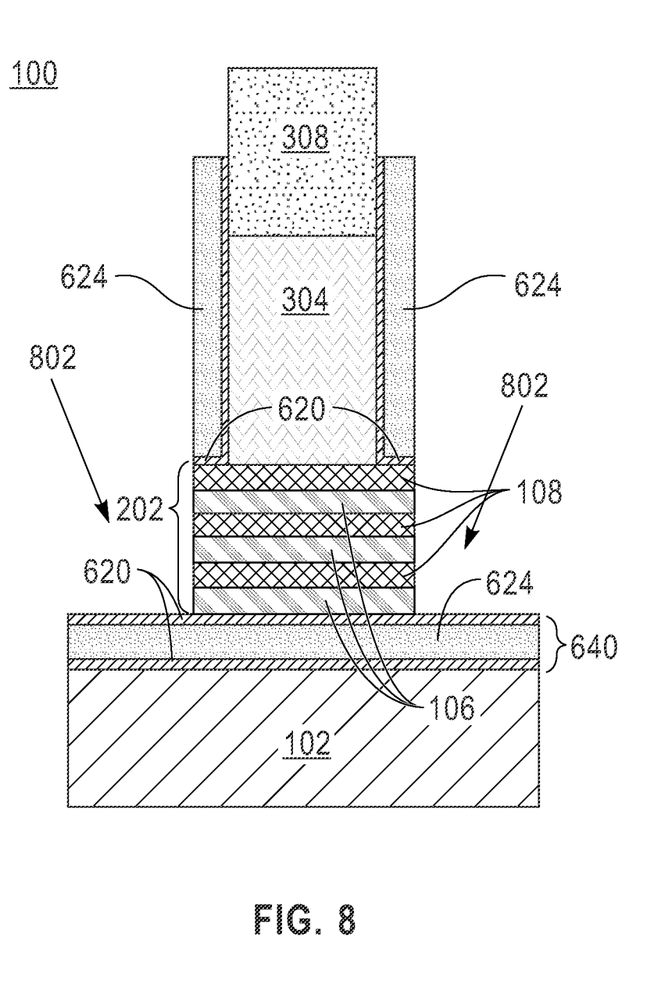
FIG. 8 is a cross-sectional view of the semiconductor structure depicting forming source/drain recesses, according to an embodiment of the present disclosure.

Referring now to FIG. 8, a cross-sectional view of the semiconductor structure 100 taken along line A-A' (FIG. 4) is shown after forming source/drain recesses 802, according to an embodiment of the present disclosure.

As shown in the figure, exposed portions of the fins 202 are removed from the semiconductor structure 100 to form source/drain recesses 802. As may be understood source/drain regions of the semiconductor structure 100 will be formed on the source/drain recesses 802, as will be described in detail below. Specifically, portions of the fins 202 extending outwards from the high-k-dielectric layer 620 and dummy gate 304 (i.e., portions of the fins 202 not covered by the high-k-dielectric layer 620 and dummy gate 304) are removed from the semiconductor structure 100. Remaining portions of the fins 202 below the high-k dielectric layer 620 and below the dummy gate 304 may be vertically aligned.

In this embodiment, upper portions of the spacer material 624 along the dummy gate 304 and upper portions of the hard mask 308 can be used as a mask to recess portions of the fins 202 that are not under the upper portions of the spacer material 624 and high-k dielectric layer 620 and below the dummy gate 304, as illustrated in the figure. In an exemplary embodiment, a RIE process can be used to recess such portions of the fins 202. Because the fin etch is being performed before the dummy gate replacement steps (described in detail below), the semiconductor device fabrication processes described herein can be referred to as a fin first process.

It should be noted that due to the high-k material forming the high-k dielectric layer 620 being harder than currently used materials, the high-k dielectric layer 620 provides an improved etch stop that may prevent punch-through of the recess etch to the semiconductor substrate 102.

Figure 9:
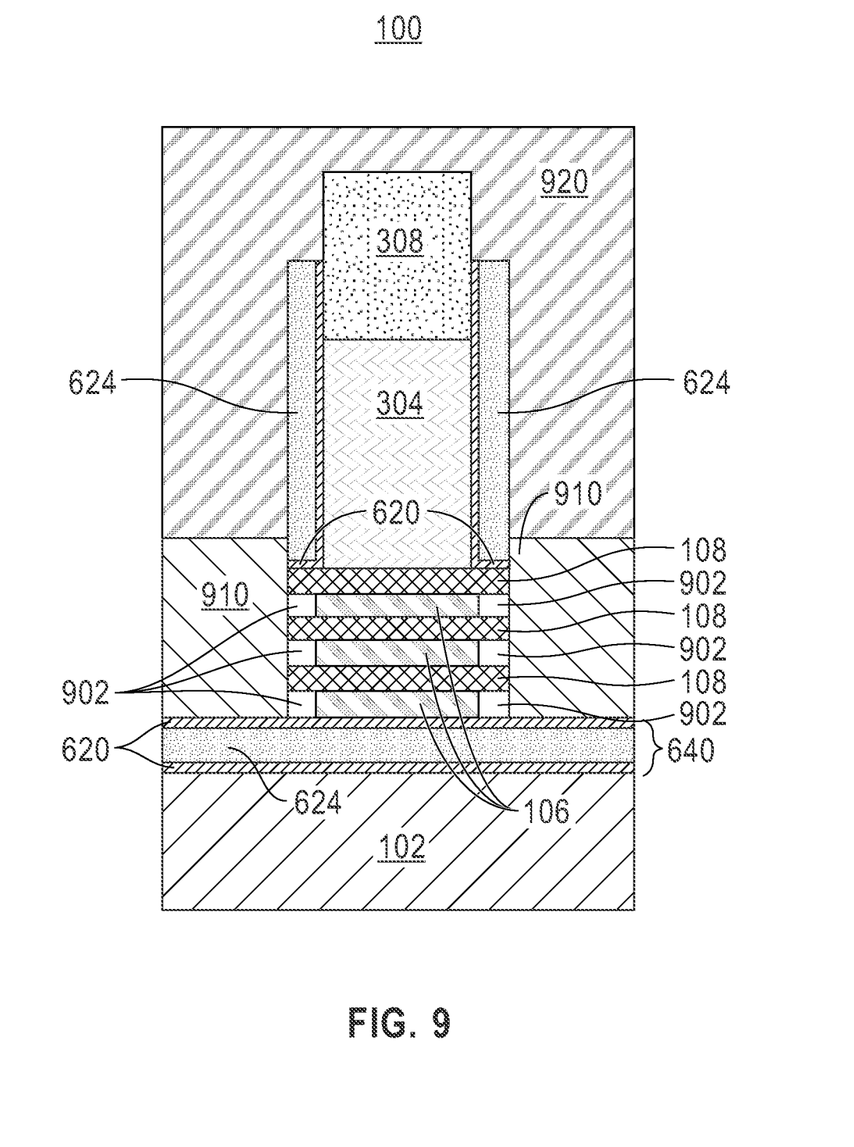
FIG. 9 is a cross-sectional view of the semiconductor structure depicting forming inner spacers, source/drain regions and an interlevel dielectric layer, according to an embodiment of the present disclosure.

Referring now to FIG. 9, a cross-sectional view of the semiconductor structure 100 taken along line A-A' (FIG. 4) is shown after forming inner spacers 902, source/drain regions 910 and an interlevel dielectric layer 920, according to an embodiment of the present disclosure.

In this embodiment, an outer portion of each of the sacrificial semiconductor layers 106 may be removed using methods known in the art. The inner spacers 902 may be formed within an indented cavity (not shown) of the sacrificial semiconductor layers 106. As depicted in the figure, outer vertical sides of the inner spacers 902 may vertically align with the semiconductor channel layers 108, and thus with upper portions of the high-k dielectric layer 620 and spacer material 624 located on opposing sidewalls of the dummy gate 304.

The inner spacers 902 can be formed, for example, by conformal deposition of an inner spacer material that pinches off the indented cavity (not shown) formed after recessing of the sacrificial semiconductor layers 106. The inner spacers 902 may include any suitable dielectric material, such as silicon dioxide or silicon nitride, and may include a single layer or multiple layers of dielectric materials.

It should be noted that since the material forming the high-k dielectric layer 620 is substantially more etch-resistant than materials used in current art, the high-k dielectric layer 620 may also prevent over-etch of the bottom dielectric isolation (BDI) 640 during processing steps such as SiGe indentation etch, inner spacer etch, and epitaxial process pre-clean steps.

After forming the inner spacers 902, source/drain regions 910 can be formed on the source/drain recesses 802 shown in FIG. 8. The source/drain regions 910 can be formed using an epitaxial layer growth process on the exposed ends of the semiconductor channel layers 108.

As depicted in the figure, the source/drain regions 910 are formed on opposing sides of the fins 202 in direct contact with end portions of the semiconductor channel layers 108 and end portions of the inner spacers 902 surrounding the sacrificial semiconductor layers 106. The source/drain regions 910 are located above the tri-layer bottom dielectric isolation 640. Specifically, the source/drain regions 910 are disposed above the upper portion of the high-k dielectric layer 620 in the tri-layer bottom dielectric isolation 640. Thus, the tri-layer bottom dielectric isolation 640 may isolate the source/drain regions 910 from the semiconductor substrate 102 preventing epitaxial growth from the semiconductor substrate 102. This critical feature withstands epitaxial patterning and pre-cleaning steps to prevent erosion and thinning. This may reduce current leakage through the semiconductor substrate 102.

After forming the source/drain regions 910, an interlevel dielectric (ILD) layer 920 is formed to fill voids in the semiconductor structure 100. The interlevel dielectric layer 920 can be formed by, for example, CVD of a dielectric material. Non-limiting examples of dielectric materials to form the interlevel dielectric layer 920 may include silicon oxide, silicon nitride, hydrogenated silicon carbon oxide, silicon based low-k dielectrics, flowable oxides, porous dielectrics, or organic dielectrics including porous organic dielectrics.

Figure 10:
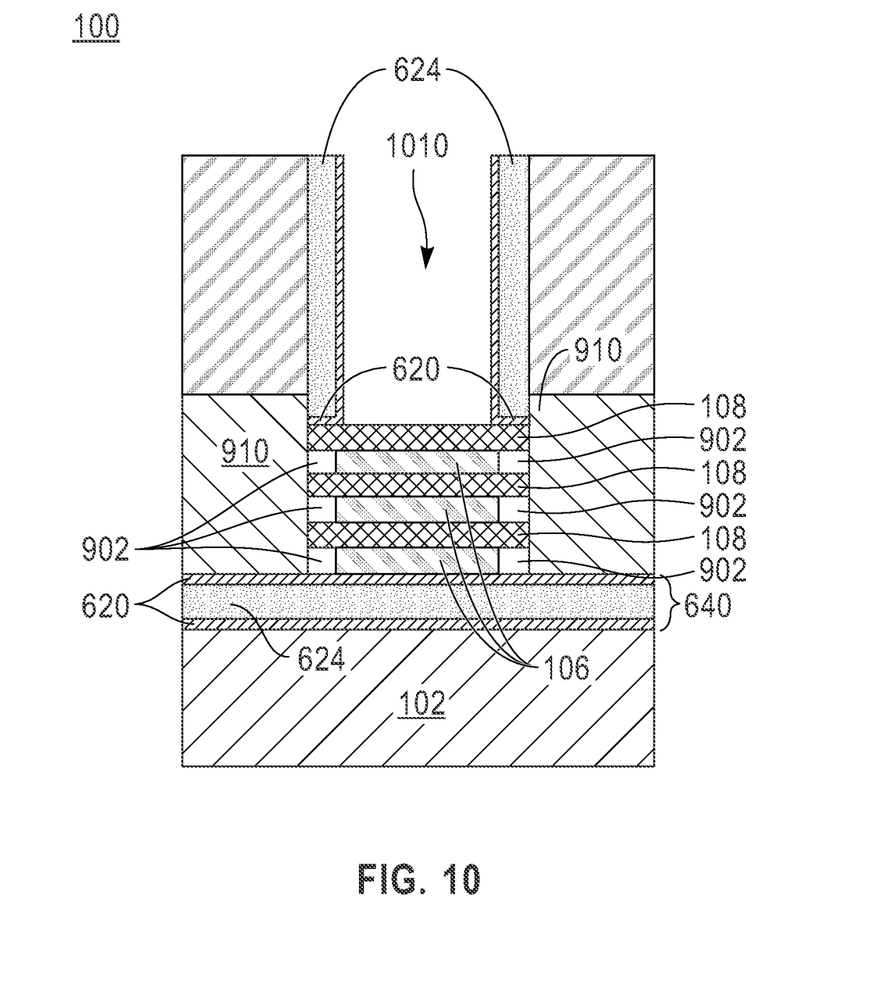
FIG. 10 is a cross-sectional view of the semiconductor structure depicting a planarization process and removal of the hard mask and dummy gate, according to an embodiment of the present disclosure.

Referring now to FIG. 10, a cross-sectional view of the semiconductor structure 100 taken along line A-A' (FIG. 4) is shown after a planarization process and removal of the hard mask 308 and dummy gate 304, according to an embodiment of the present disclosure.

After deposition of the interlevel dielectric layer 920, a planarization process, such as a chemical mechanical polishing (CMP), can be conducted on the semiconductor structure 100. This process may expose a top surface of the dummy gate 304 (FIG. 9) in preparation for removal of the dummy gate 304 (FIG. 9).

In an exemplary embodiment, the dummy gate 304 (FIG. 9) can be removed by known etching processes including, for example, RIE or chemical oxide removal (COR). In a gate-last fabrication process, the removed dummy gate 304 (FIG. 9) is thereafter replaced with a metal gate (not shown) as known in the art. A recess 1010 remains on the semiconductor structure 100 after removal of the dummy gate 304 (FIG. 9). As illustrated in the figure, the recess 1010 exposes inner vertical surfaces of the high-k dielectric layer 620 and a top horizontal surface of the uppermost semiconductor channel layer 108.

Figure 11:
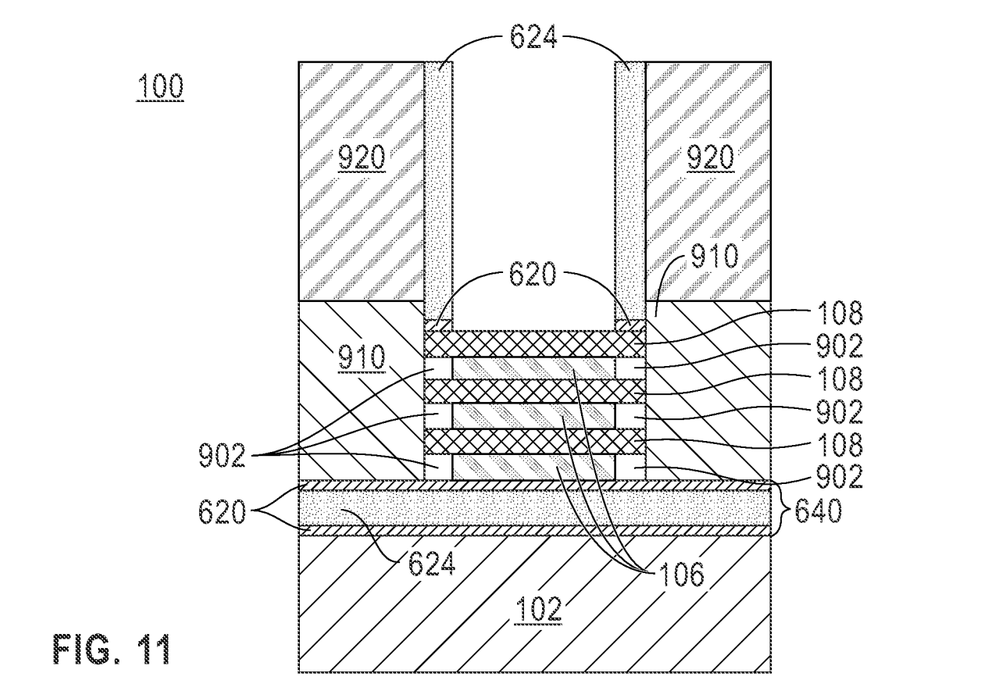
FIG. 11 is a cross-sectional view of the semiconductor structure depicting removing exposed portions of the high-k dielectric layer, according to an embodiment of the present disclosure.

Referring now to FIG. 11, a cross-sectional view of the semiconductor structure 100 taken along line A-A' (FIG. 4) is shown after removing portions of the high-k dielectric layer 620 exposed by the recess 1010, according to an embodiment of the present disclosure.

In this embodiment, an isotropic etch can be conducted on the semiconductor structure 100 to remove vertical surfaces of the high-k dielectric layer 620 exposed by the recess 1010 and located on opposing sidewalls of the spacer material 624, as depicted in FIG. 10. Horizontal portions of the high-k dielectric layer 920 located above the uppermost semiconductor channel layer 108 and below the spacer material 624 remain in the semiconductor structure 100, as depicted in FIG. 11. In an exemplary embodiment, a wet etch or plasma etch can be performed on the semiconductor structure 100 to remove vertical portions of the high-k dielectric layer 620 from sidewalls of the spacer material 624.

The sacrificial semiconductor layers 106 can now be removed from the semiconductor structure 100. In an exemplary embodiment, the sacrificial semiconductor layers 106 can be removed by known etching processes including, for example, RIE, wet etch or dry gas (HCl). Removal of the sacrificial semiconductor layers 106 create cavities (not shown) between the inner spacers 902 that will subsequently be filled with corresponding work function metals, as will be described in detail below.

Figure 12:
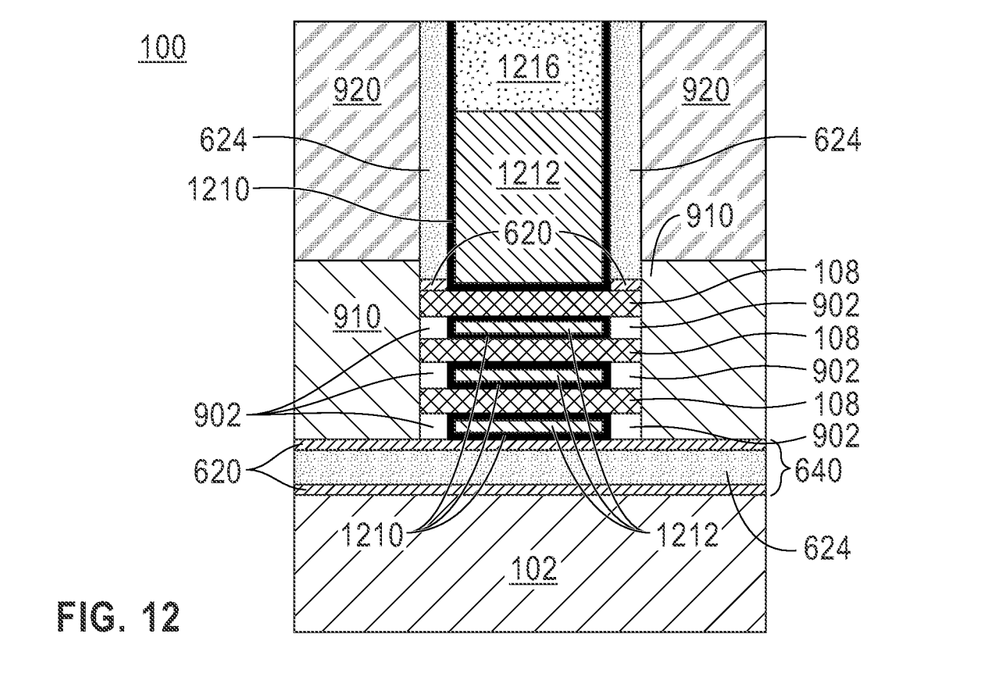
FIG. 12 is a cross-sectional view of the semiconductor structure depicting the deposition of a gate dielectric stack and a metal gate stack, according to an embodiment of the present disclosure.

Referring now to FIG. 12, a cross-sectional view of the semiconductor structure 100 taken along line A-A' (FIG. 4) is shown after deposition of a gate dielectric stack 1210 and a metal gate stack 1212, according to an embodiment of the present disclosure.

The gate dielectric stack 1210 is formed within the recess 1010 (FIG. 11) and cavities formed within the inner spacers 902 after removal of the sacrificial semiconductor layers 106. In some embodiments, the gate dielectric stack 1210 includes a layer of silicon oxide and a layer of a high-k dielectric material, such as a hafnium based material. The metal gate stack 1212 is deposited above the gate dielectric stack 1210 to complete the gate formation. The metal gate stack 1212 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 12, the metal gate stack 1212 surround (stacked) semiconductor channel layers 108. In some embodiments, a gate cap 1216 may be formed above the metal gate stack 1212.

After forming the gate dielectric stack 1210, the metal gate stack 1212 and the gate cap 1216, a chemical mechanical polishing (CMP) may be conducted to remove excess material and polish upper surfaces of the semiconductor structure 100.

Figure 13:
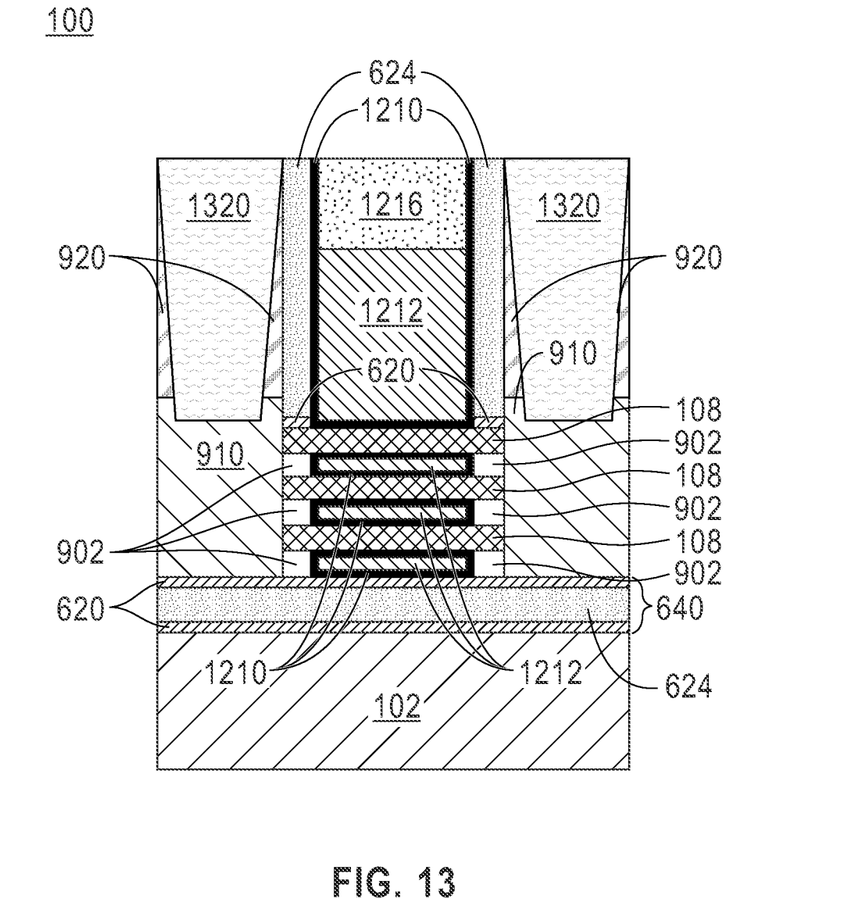
FIG. 13 is a cross-sectional view of the semiconductor structure depicting forming source/drain contacts, according to an embodiment of the present disclosure.

Referring now to FIG. 13, a cross-sectional view of the semiconductor structure 100 taken along line A-A' (FIG. 4) is shown after forming source/drain contacts 1320, according to an embodiment of the present disclosure.

As illustrated in the figure, source/drain contacts 1320 extends through the source/drain regions 910. The process of forming source/drain contacts is standard and well-known in the art. Typically, the process includes forming trenches (not shown) within the interlevel dielectric layer 920 and subsequently filling the trenches with a conductive material or a combination of conductive materials to form the source/drain contacts 1320. The conductive material filling the source/drain contacts 1320 includes a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100.

Although not shown in the figure, gate contacts to the metal gate stack 1212 may also be formed on the semiconductor structure 100 using similar conductive materials and analogous processing techniques as for the source/drain contacts 1320.

Therefore, embodiments of the present disclosure, provide a tri-layer bottom dielectric isolation (BDI) region located between the nanosheet stack 10 of alternating sacrificial semiconductor layers 106 and semiconductor channel layers 108 and the semiconductor substrate 102 in which an isolation material (i.e., the spacer material 624) is sandwiched between layers of a high-k dielectric material (i.e., the high-k dielectric layer 620) for providing a BDI consisting of etch-resistant materials that can prevent etch-out problems and electrically isolate source/drain epi regions from the semiconductor substrate 102. This in turn may reduce leakage via the semiconductor substrate 102 and improve device performance.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a bottom dielectric isolation disposed above a semiconductor substrate, the bottom dielectric isolation comprising a first portion of a high-k dielectric layer above and in direct mechanical contact with the semiconductor substrate, a spacer material above and in direct mechanical contact with the first portion of the high-k dielectric layer, and a second portion of the high-k dielectric layer above and in direct mechanical contact with the spacer material;
a sequence of semiconductor channel layers stacked perpendicularly to the semiconductor substrate and above the bottom dielectric isolation, the sequence of semiconductor channel layers being separated by and vertically aligned with metal layers of a metal gate stack, each metal layer of the metal gate stack being interior to a respective gate dielectric stack of a sequence of gate dielectric stacks, each metal layer of the metal gate stack comprising one or more work function metals, wherein the second portion of the high-k dielectric layer is in direct mechanical contact with a lowest gate dielectric stack that encloses a lowest metal layer of the metal gate stack;
source/drain regions extending laterally from opposite ends of the semiconductor channel layers, a bottom surface of the source/drain regions being in direct contact with the bottom dielectric isolation for electrically isolating the source/drain regions from the semiconductor substrate;
an uppermost portion of the metal gate stack disposed between portions of the spacer material perpendicular to the semiconductor substrate; and
a third portion of the high-k dielectric layer below each portion of the spacer material perpendicular to the semiconductor substrate, wherein the metal gate stack disposed between the portions of the spacer material and the third portion of the high-k dielectric layer are above an uppermost semiconductor channel layer of the sequence of semiconductor channel layers.

2. The semiconductor structure of claim 1, wherein a first gate dielectric stack of the sequence of gate dielectric stacks surrounds a first metal layer of the metal gate stack; and wherein inner spacers are located on opposite sides of the first gate dielectric stack.

3. The semiconductor structure of claim 1, wherein a lowermost portion of the metal gate stack is above the bottom dielectric isolation.

4. The semiconductor structure of claim 1, further comprising:
a gate cap disposed above the uppermost portion of the metal gate stack between the portions of the spacer material perpendicular to the semiconductor substrate.

5. The semiconductor structure of claim 1, further comprising:
an interlevel dielectric layer disposed above the source/drain regions and disposed along sidewalls of the portions of the spacer material perpendicular to the semiconductor substrate.

6. The semiconductor structure of claim 5, further comprising:
Source/drain contacts extending through the interlevel dielectric layer until a top surface of the source/drain regions.

7. The semiconductor structure of claim 1, wherein the high-k dielectric layer comprises an etch resistant high-k material selected from the group consisting of: hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zine niobate.

8. The semiconductor structure of claim 1, wherein the spacer material is selected from the group consisting of silicon oxycarbide (SiOC), silicon carbon nitride (SiCN), silicon carbide (SiC), aluminum oxide (AlOx).

9. A method of forming a semiconductor structure, comprising:
 forming a bottom dielectric isolation above a semiconductor substrate, the bottom dielectric isolation comprising a first portion of a high-k dielectric layer above and in direct mechanical contact with the semiconductor substrate, a spacer material above and in direct mechanical contact with the first portion of the high-k dielectric layer, and a second portion of the high-k dielectric layer above and in direct mechanical contact with the spacer material;
 forming a sequence of semiconductor channel layers stacked perpendicularly to the semiconductor substrate and above the bottom dielectric isolation, the sequence of semiconductor channel layers being separated by and vertically aligned with metal layers of a metal gate, each metal layer of the metal layer stack being interior to a respective gate dielectric stack of a sequence of gate dielectric stacks, each metal layer of the metal gate stack comprising one or more work function metals, wherein the second portion of the high-k dielectric layer is in direct mechanical contact with a lowest gate dielectric stack that encloses a lowest metal layer of the metal gate stack;
 forming source/drain regions extending laterally from opposite ends of the semiconductor channel layers, a bottom surface of the source/drain regions being in direct contact with the bottom dielectric isolation for electrically isolating the source/drain regions from the semiconductor substrate;
 forming an uppermost portion of the metal gate stack disposed between portions of the spacer material perpendicular to the semiconductor substrate; and
 forming a third portion of the high-k dielectric layer below each portion of the spacer material perpendicular to the semiconductor substrate, wherein the metal gate stack disposed between the portions of the spacer material and the third portion of the high-k dielectric layer are above an uppermost semiconductor channel layer of the sequence of semiconductor channel layers.

10. The method of claim 9, wherein forming the bottom dielectric isolation further comprises:
 forming a nanosheet stack on the semiconductor substrate, the nanosheet stack comprising a nanosheet stack sacrificial layer above the semiconductor substrate and an alternating sequence of sacrificial semiconductor layers and the semiconductor channel layers;
 patterning the nanosheet stack to form a fin;
 forming a dummy gate on the fin; and
 selectively removing the nanosheet stack sacrificial layer from the nanosheet stack, wherein removing the nanosheet stack sacrificial layer creates an opening between the fin and the semiconductor substrate.

11. The method of claim 10, further comprising:
 conformally depositing the high-k dielectric layer within the opening and above a top surface of an uppermost semiconductor channel layer and opposite sidewalls of the dummy gate;
 depositing the spacer material above the high-k dielectric layer and within an open innermost portion of the opening;
 partially removing portions of the spacer material and portions of the high-k dielectric material extending laterally above the uppermost semiconductor channel layer; and
 using remaining portions of the spacer material and high-k dielectric layer along sidewalls of the dummy gate as a mask, laterally etching the fin in a way such that a remaining portion of the fin is vertically aligned with the remaining portions of the spacer material and the high-k dielectric layer.

12. The method of claim 11, further comprising:
 forming inner spacers on opposite sides of the sacrificial semiconductor layers;
 epitaxially growing the source/drain region from the semiconductor channel layers; and
 forming an interlevel dielectric layer disposed above the source/drain regions and disposed along sidewalls of the portions of the spacer material perpendicular to the semiconductor substrate.

13. The method of claim 12, further comprising:
 removing portions of the high-k dielectric perpendicular to the semiconductor substrate extending along inner sidewalls of the spacer material; and
 replacing the dummy gate and each of the sacrificial semiconductor layers with the metal gate stack.

14. The method of claim 13, wherein the metal gate stack further comprises:
 a gate dielectric surrounding the metal gate stack; and
 a gate cap disposed above a top surface of the metal gate stack located between portions of the spacer material perpendicular to the semiconductor substrate.

15. The method of claim 12, further comprising:
 forming source/drain contacts extending through the interlevel dielectric layer until a top surface of the source/drain regions.

16. The method of claim 9, wherein the high-k dielectric layer comprises an etch resistant high-k material selected from the group consisting of: hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zine niobate.

17. A semiconductor structure, comprising:
 a bottom dielectric isolation disposed above a semiconductor substrate, the bottom dielectric isolation comprising a first portion of a high-k dielectric layer above the semiconductor substrate, a spacer material above the first portion of the high-k dielectric layer, and a second portion of the high-k dielectric layer above the spacer material;
 a sequence of semiconductor channel layers stacked perpendicularly to the semiconductor substrate and above the bottom dielectric isolation, the sequence of semiconductor channel layers being separated by and vertically aligned with a metal gate stack;

source/drain regions extending laterally from opposite ends of the semiconductor channel layers, a bottom surface of the source/drain regions being in direct contact with the bottom dielectric isolation for electrically isolating the source/drain regions from the semiconductor substrate; and a third portion of the high-k dielectric layer disposed between, and in direct mechanical contact with, the spacer material and an uppermost semiconductor channel layer of the sequence of semiconductor channel layers.

18. The semiconductor structure of claim 17, wherein the third portion of the high-k dielectric layer disposed between, and in direct mechanical contact with, the source/drain regions and an uppermost gate dielectric stack of the sequence of gate dielectric stacks, and wherein an uppermost metal layer of the metal gate stack is interior to, and in direct mechanical contact with, the uppermost gate dielectric stack.

* * * * *